United States Patent [19]

Noguchi et al.

[11] Patent Number: 4,567,598
[45] Date of Patent: Jan. 28, 1986

[54] OPTOELECTRONIC SEMICONDUCTOR DEVICES IN HERMETICALLY SEALED PACKAGES

[75] Inventors: Shozo Noguchi; Yasunobu Oshima; Tohru Kamata, all of Tokyo, Japan

[73] Assignee: Nippon Electric Co., Ltd., Tokyo, Japan

[21] Appl. No.: 468,316

[22] Filed: Feb. 22, 1983

[30] Foreign Application Priority Data

Feb. 23, 1982 [JP] Japan .................. 57-27603

[51] Int. Cl.⁴ .................. H01S 3/04; H01L 23/36
[52] U.S. Cl. .................. 372/36; 357/74; 357/81
[58] Field of Search .................. 372/36; 357/74, 81, 357/17, 65; 174/16 HS; 165/80 B

[56] References Cited

U.S. PATENT DOCUMENTS

| | | | |
|---|---|---|---|
| 3,816,847 | 6/1974 | Nagao .................. | 357/81 |
| 3,869,702 | 3/1975 | Backhouse et al. .................. | 357/81 |
| 4,295,152 | 10/1981 | Khoe et al. .................. | 357/81 |

FOREIGN PATENT DOCUMENTS

| | | | |
|---|---|---|---|
| 0101296 | 9/1979 | Japan .................. | 372/36 |
| 0158890 | 12/1979 | Japan .................. | 357/17 |
| 0162986 | 12/1979 | Japan .................. | 372/36 |

Primary Examiner—James W. Davie
Assistant Examiner—Vangelis Economon
Attorney, Agent, or Firm—Burns, Doane, Swecker and Mathis

[57] ABSTRACT

A hermetically sealed optoelectronic semiconductor device and package assembly comprises a metallic stud providing an electrical connection to one of the device electrodes, and a heat sink mounting block for the device mounted on and electrically connected to the stud. The device is mounted on the mounting block so that the optical axis of the device is aligned with the stud axis. The mounting block has a substantially annular bottom coaxial with the stud axis so that thermal stress generated between the stud and the mounting block will be substantially balanced and deviation of the optical axis of the device will be minimized. A gap can be provided in the annular bottom to accommodate an electrical lead to which the other of the device electrodes is connected. Alternatively, the annular bottom is continuous and the electrical lead passes through the central passage provided in the stud.

6 Claims, 5 Drawing Figures

OPTOELECTRONIC SEMICONDUCTOR DEVICES IN HERMETICALLY SEALED PACKAGES

BACKGROUND OF THE INVENTION

This invention relates to optoelectronic semiconductor devices such as a laser diode, a light emitting diode or a photo diode in hermetically sealed packages, and more particularly to such devices having heat sink structure.

One such laser diode is disclosed in U.S. Pat. No. 3,869,702. There, one side of a laser diode is mounted onto a heat sink consisting of a copper block which is in turn secured on the top of a steel stud having a hole therein. The heat sink itself is positioned to cover just less than a semi-cylinder of the stud hole so that its side face is displaced from an optical axis of the laser diode by an amount which will cause a laser diode mounted thereon to lie on axis. A hollow stem protruding from the opposite face of the stud permits passage of a lead through the hollow stem for providing the other connection for the laser diode. The lead is electrically insulated from the hollow stem by means of a sealing glass.

It is well known that the temperature of the laser diode must be maintained as low as possible, while the laser diode should be contained in a hermetically sealed package. Therefore, when a heat sink is made of a high thermal conductivity material such as copper, while a stud is made of a material such as steel a Kovar having a thermal coefficient of expansion close to sealing glass, an excellent hermetically sealed package will be made. (Kovar is a trademark for an alloy containing approximately 29% nickel, 17% cobalt and 0.3% manganese, the balance being essentially iron.) However, for such an excellent package, when either ambient temperature or output power is varied, it is inevitable to cause a thermal stress between the copper block and the steel stud due to the different thermal coefficients of expansion. In the prior art structure, since the bottom of the copper block is positioned on half of the steel stud, the thermal stress is caused only at one side thereof. Such unbalanced partial thermal stress deviates the optical axis of the laser diode from the center axis of the stud. In the past, the above-mentioned axial deviation has never been a concern. In the case of coupling a laser light to a single mode optical fiber, however, axial deviation preferably should be restricted within 0.5 microns. It is hardly possible with conventionally packaged semiconductor devices to achieve such a strict tolerance of the axial deviation.

SUMMARY OF THE INVENTION

It is therefore an object of the present invention to provide an optoelectronic semiconductor device in a hermetically sealed package wherein axial deviation between the device and the package is minimized without spoiling other excellent characteristics of the package.

According to the present invention, a hermetically sealed optoelectronic semiconductor device-package assembly includes a metallic stud, a mounting block secured onto the stud, and a lead penetrating the stud. The mounting block has an annular bottom substantially coaxial to the stud so that all thermal stress caused in a radial direction can be offset.

The annular bottom may have a gap for an electrical lead to pass therethrough. An optoelectronic semiconductor device is preferably mounted on the mounting block with its optical axis being substantially in parallel with the axis of the stud. The optoelectronic semiconductor device has a pair of electrodes. One of the electrodes is electrically and thermally connected to the mounting block and the other electrode is electrically connected to the lead.

DETAILED DESCRIPTION OF THE INVENTION

A hermetically sealed optoelectronic semiconductor assembly constructed according to the present invention will now be described in more detail with reference to the previously suggested assembly configuration. For the convenience of description, a laser diode is used as an example of the optoelectronic semiconductor devices which have been so packaged.

Figure 1A:
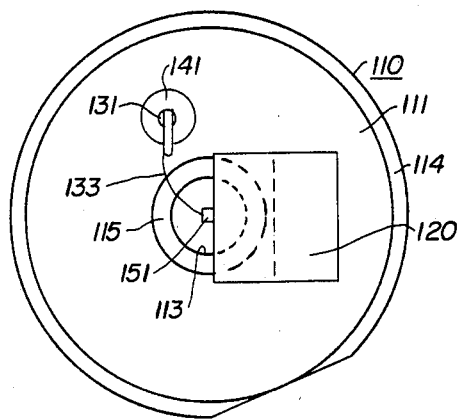
FIG. 1A is a top view of a prior art hermetically sealed optoelectronic semiconductor assembly having a mount structure for a laser diode.
Figure 1B:
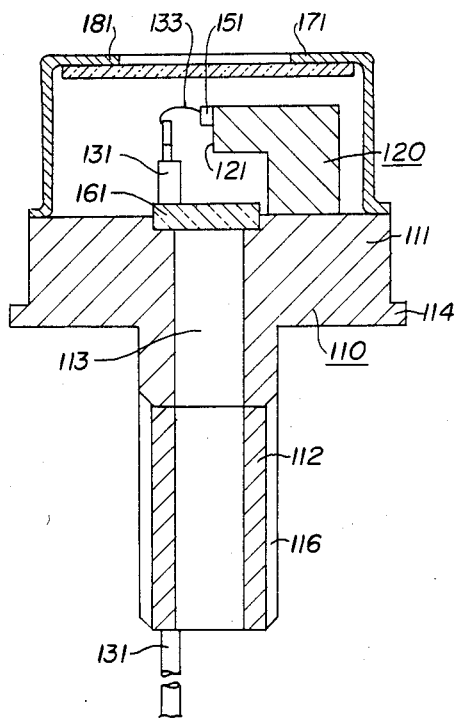
FIG. 1B is a cross-sectional view of the assembly shown in FIG. 1A.

Referring to FIG. 1A and FIG. 1B, a steel stud 110 has a pedestal portion 111 and an externally threaded stem portion 112. The stud 110 is provided with a coaxial hole 113. The hole 113 is covered with a transparent window 161 such as a glass plate or sapphire plate and hermetically sealed by means of sealing glass.

A mounting block 120 is secured onto the top surface of the stud 110 as a heat sink by using solder or metal paste. The block 120 has a square bottom and is provided with a small recess providing clearance for the glass plate 161. A laser diode 151 is mounted on the side face 121 of the mounting block 120 so that one electrode of the laser diode 151 is electrically and thermally connected to the block 120. The other electrode is connected through a bonding wire 133 to an external lead 131 which penetrates the pedestal portion 111. The lead 131 is electrically insulated from the stud and hermetically sealed with sealing glass 141. A metal cap 171 fitted with a transparent window 181 is secured onto the top of the stud 110 to provide a seal around the laser diode 151.

According to this suggested structure, however, since the bottom of the mounting block 120 is positioned on one half side of the pedestal portion 111, a thermal stress due to the difference of thermal coefficient of expansion is caused only at one side of the pedestal portion 111. Such unbalanced partial thermal stress deviates the optical axis of the laser diode from the initial position fixed at assembly process. Needless to say, the initial position favorably concides with the central axis of the stud.

Figure 2A:
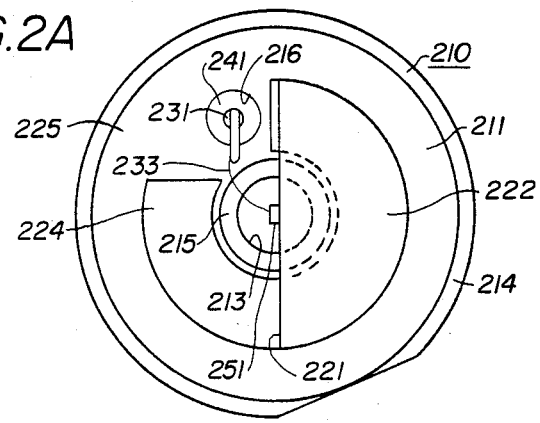
FIG. 2A is a top view of a hermetically sealed optoelectronic semiconductor assembly according to the present invention.
Figure 2B:
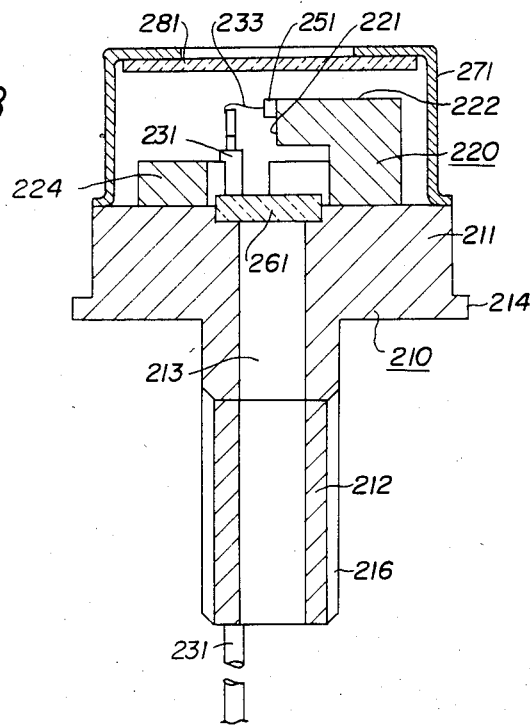
FIG. 2B is a cross-sectional side elevation view of the assembly shown in FIG. 2A.

Now referring to FIG. 2A and FIG. 2B, which illustrates an assembly constructed according to the present invention, an electrically conductive stud 210 has a pedestal portion 211 and an externally threaded stem portion 212. The stud 210 is provided with a coaxial hole 213. The hole 213 is hermetically sealed with a transparent window 261. A mounting block 220 is secured onto the pedestal portion 211 as a heat sink. The block 220 has an annular bottom 224 surrounding the transparent window 261. A protruding portion 222 extends from the annular bottom 224 and is positioned on one half side of the pedestal portion 211. The protruding portion has a side surface 221 to electrically and thermally mount one electrode of a laser diode 251. The other electrode is connected through a bonding wire 233 to an external lead 231 which penetrates the pedestal portion 211. The lead 231 is electrically insulated from the stud and hermetically sealed with a glass. The annular bottom 224 of the mounting block 220 has a gap 225 for the lead 231 to pass therethrough.

The gap 225 is large enough to accommodate the stud through hole 216 for head 231 but less than one fourth of the top surface of the stud 210.

The cylindrical metal cap 271 is simply a conventional cap made of Kovar and welded on the stud 210 in such a manner as to form a hermetic seal over the laser diode 251. The cylindrical cap 271 has a clear glass window 281 such that light generated from the emitting surface of the laser diode 251 can be transmitted to any light transmitting medium outside the hermetically sealed laser diode package. The metal cap 271 is not essential to minimize axial deviation.

The stud 210 should be of a metallic material with good electrical conductivity and a thermal coefficient of expansion close to the thermal coefficient of expansion of the sealing glass 241 so as to provide a good glass-to-metal seal. Typically, such a material is steel, iron or iron-nickel aloy such as Kovar.

The mounting block 220 should be of a metallic material of high electrical and thermal conductivity, typically copper or oxygen-free high-conductivity copper.

The mounting block 220 electrically attached to the stud 210 is one of the electrical contacts for the laser diode 251. The other electrical contact is the lead 231 penetrating the stud 210. A bonding wire 233 is used to electrically connect the lead 231 to the diode 251. The bonding wire 233 is made of a metallic material of very high electrical conductivity, such as gold or aluminium.

In the above embodiment, since the annular bottom 224 is secured to the pedestal portion so as to surround the transparent window 281, a thermal stress is caused in a radial direction and thus all of thermal stresses substantially offset each other. For this reason, it is preferable to design the bottom of the heat sink to be circular and coaxial with the stud axis. However, the bottom need not necessarily be a full circle. For a practical usage, it is preferable to provide a bottom which extends more than three fourths of the full circule.

When the lead 231 is positioned at the hole 213 of the stud 210 as in the case of the aforementioned U.S. Pat. No. 3,869,702, the annular bottom 224 can be completely circular in shape which provides a better condition with respect to thermal stress. In such alternative structure, however, a light emitted backward cannot be derived from the central hole 213 of the stud 210.

Those parts of the laser diode-package assembly that are relevant to the small axial deviation are the stud 210 and the mounting block 220. A typical example of each will now be described. The hollow stud 210 is made of iron. The stem portion 212 has an external diameter of 3.0 mm and a height of 7 mm. The pedestal portion 211 has an external diameter of 8.4 mm, an external diameter at flange 214 of 9.1 mm and a height of 2.5 mm. The hole 213 coaxial to the stud 210 is common to both the pedestal and stem portions and has a diameter of 1.6 mm.

The circular recess 215 is provided in the top end of the hole 213 to accommodate the transparent window 261 made of a glass plate. The recess 215 has a diameter of 2.5 mm and a depth of 0.3 mm. The glass plate 261 has a diameter of 2.45 mm and a thickness of 0.6 mm. The glass plate 261 is hermetically sealed to the recess 215 by using a sealing means such as sealing glass.

The pedestal portion 211 has a through hole 216 through which the lead 231 penetrates and which is insulated by the sealing glass 241. The through hole 216 has a diameter of 1.2 mm. The lead 231 is made of iron-nickel alloy and has a diameter of 0.45 mm.

The mounting block 220 is made of oxygen-free copper and has an annular bottom 224 coaxial to the stud 210 and a protruding portion extending from a part of the annular bottom 224. The annular bottom has a gap 225 for the lead 231 to pass therethrough and thus the bottom 224 is C-shaped. The C-shaped bottom 224 has an outer diameter of 6.0 mm, an inner diameter of 2.8 mm and a height of 1.0 mm. The protruding portion has the D-shaped head 222 positioned in relative alignment with one half side of the top surface of the stud 210. The D-shaped head 222 has a flat mount face 221 for a laser diode and has a height of 1.0 mm while the mounting block 220 has a total height of 2.5 mm. The mount face 221 is spaced from alignment with the central axis of the stud 210 by an amount which will cause the optical axis of the laser diode to substantially coincide with the central axis of the stud 210.

Figure 3:
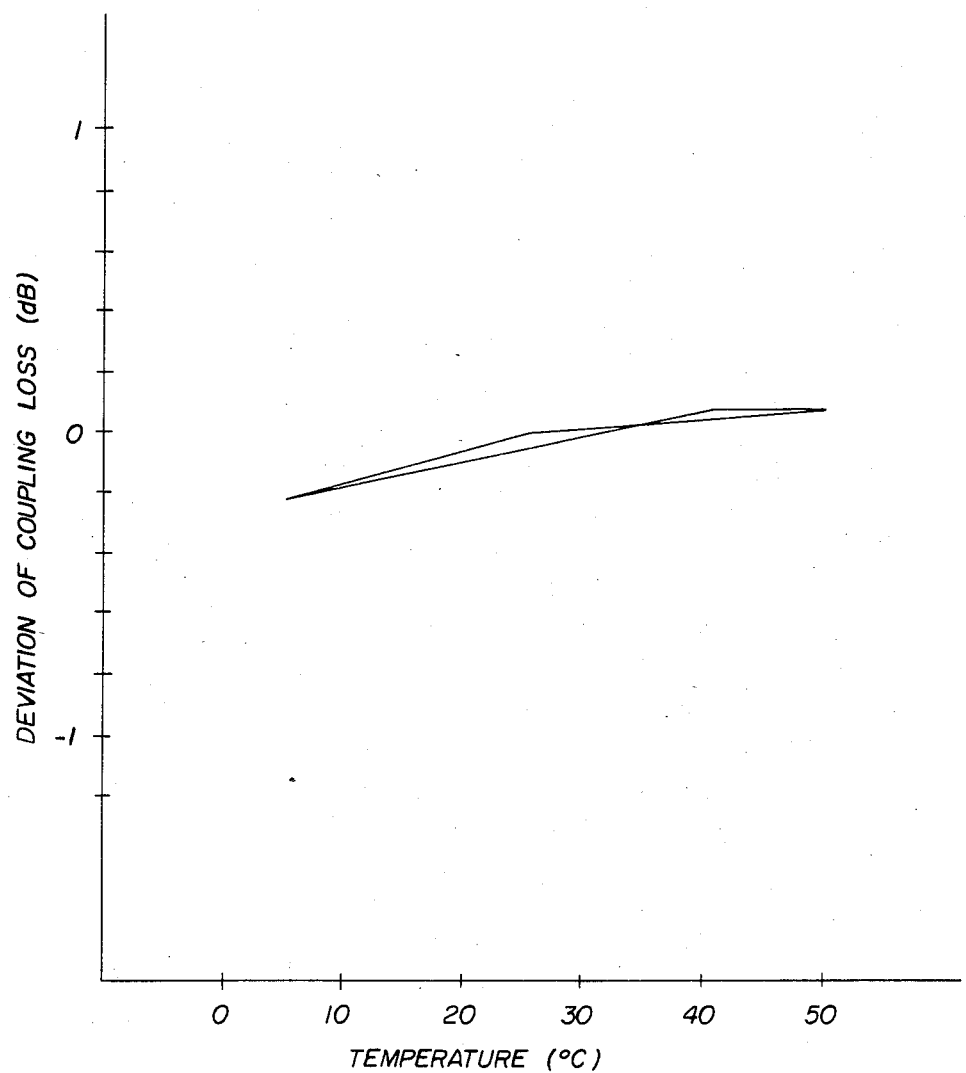
FIG. 3 is a graph showing the coupling loss-temperature characteristics of the assembly illustrated in FIGS. 2A and 2B.

Referring to FIG. 3, assessment of the deviation of the semiconductor device with respect to the package is done by measuring the deviation of light coupling loss to the temperature change of the stud. The coupling loss at 25° C. is determined as 0 dB. As is shown in FIG. 3, the deviation of coupling loss is not larger than 0.3 dB when the temperature is varied from 5° C. to 50° C. after decreasing from the initial temperature of 25° C. to 5° C., and then returned to 25° C. Estimating that the axial deviation of one micron corresponds to the coupling loss of 1.5~2 dB, it is estimated that the laser diode-package assembly of the above embodiment has an axial deviation of less than 0.3 microns.

On the other hand, the previously suggested laser diode-package assembly shown in FIGS. 1A and 1B is estimated to cause an axial deviation of 0.8 microns to one micron.

From the foregoing, it is apparent that the assembly of the present invention has a superior properties to those of the prior art assembly.

If axial deviation is the only consideration, it is expected that an improved assembly can be achieved by making the annular bottom of the mounting block fully circular in shape. Such improved package can be easily obtained by passing the lead through the central hole of the stud instead of providing a passage for a monitoring light. However, for an optical fiber communication system, it is preferable to employ the embodiment shown in FIGS. 2A and 2B. This is because the monitoring light is necessary to control the laser output at a substantially constant level.

As is apparent from the foregoing, the present invention provides an exceptional hermetically sealed optoelectronic semiconductor assembly wherein axial deviation is minimized and fluctuation of light signals in optical fiber communication systems reduced. Further-more, since proper materials for the stud and the mounting block can be respectively selected, the excellent operational characteristics of the semiconductor devices are not spoiled. In addition, since the contact region of the mounting block to the stud is increased in accordance with the present invention, thermal dispersion is also improved, which improves the reliability of the semi-conductor device.

It is to be understood that the foregoing description of specific examples of this invention is made by way of example only and is not to be considered as a limitation on its scope.

What is claimed is:

1. Optoelectronic semiconductor apparatus comprising:
    an optoelectronic semiconductor device having a pair of electrodes;
    a circular stud for providing an electric connection to one electrode of said device, said stud having a coaxial hole to pass light propagated to or from said device;
    a transparent window provided on said circular stud to cover said coaxial hole;
    a lead penetrating said stud adjacent said window for providing an electric connection to the other electrode of said device;
    an insulating means for electrically insulating said lead from said stud, said insulating means maintaining hermetic sealing for said lead and stud;
    a mounting block secured onto said stud and having a thermal expansion coefficient different from that of said stud, said block having a C-shaped portion in contact with said stud such that said C-shaped portion surrounds said transparent window in a plan view except for a gap and said lead is positioned in the gap of said C-shaped portion, said block further including a protruding portion extending from said C-shaped portion in a direction away from said stud, said protruding portion being electrically and thermally attached to said device and being positioned to provide light propagation to or from said device in a direction axially of said stud, said C-shaped portion having inner and outer edges substantially coaxial to said circular stud; and
    a cap with a window substantially transparent to light directed to or from said device, said cap being secured to said stud to form a sealed enclosure for said device.

2. The apparatus of claim 1, wherein said C-shaped portion of said block extends more than three-fourths of a full circle.

3. The apparatus of claim 1 wherein said mounting block is made of copper or oxygen-free copper and said stud is made of iron or Kovar.

4. Laser diode apparatus comprising:
    a laser diode having opposed first and second light output surfaces and having first and second electrodes;
    a metallic stud for providing electric power to said first electrode of said diode, said stud including a circular pedestal having first and second major surfaces in parallel with each other and an externally threaded circular stem coaxial to said circular pedestal and extending from said first surface of said pedestal, said circular pedestal and said circular stem having a common circular hole coaxial thereto extending in the direction of the common axis thereof;
    a transparent window hermetically secured to said second surface of said pedestal to cover said hole for allowing light from said first output surface of said diode to pass through said hole to the outside;
    a lead penetrating said pedestal from said second surface to said first surface thereof and extending beyond said first and second surfaces of said pedestal for providing electric power to said second electrode of said diode, said lead being located adjacent said transparent window at said second surface of said pedestal;
    a means for insulating and providing a heremetic seal between said lead and said pedestal and having a thermal expansion coefficient close to said lead and said pedestal for keeping a hermetic seal against thermal stress;
    a metallic block electrically and mechanically connected to said second surface of said pedestal and having a thermal expansion coefficient different from that of said pedestal, said block including a C-shaped portion having a flat bottom electrically and mechanically connected to said second surface of said pedestal at a position around said transparent window and having a gap, such that said lead extending beyond said second surface of said pedestal is located in the gap of said C-shaped portion, said block further including a protruding portion extending from said C-shaped portion in a direction away from said pedestal and a D-shaped portion provided on said protruding portion having a substantially flat edge wall located above said transparent window;
    means for electrically and mechanically connecting said first electrode of said laser diode to said edge wall of said D-shaped portion of said block;
    a wire electrically connecting said second electrode of said laser diode to said lead extending beyond said second surface of said pedestal; and
    a cap with a window substantially transparent to output light from said second output surface of said diode, said cap being secured to said pedestal to form a sealed enclosure for said diode.

5. The apparatus of claim 4, wherein said C-shaped portion of said block extends in a plan view in an annular direction more than three-fourths of a full circle.

6. The apparatus of claim 4 wherein said metallic block is made of copper or oxide-free copper and said stud is made or iron or Kovar.

* * * * *